(12) United States Patent
Xu

(10) Patent No.: US 9,979,370 B2
(45) Date of Patent: May 22, 2018

(54) NETWORK FILTERING CIRCUIT FOR PROTECTION LIGHTNING SURGE

(71) Applicant: FOXCONN INTERCONNECT TECHNOLOGY LIMITED, Grand Cayman (KY)

(72) Inventor: Yong-Chun Xu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 65 days.

(21) Appl. No.: 15/088,143

(22) Filed: Apr. 1, 2016

(65) Prior Publication Data

US 2016/0294347 A1 Oct. 6, 2016

(30) Foreign Application Priority Data

Apr. 3, 2015 (CN) .......................... 2015 1 0156242

(51) Int. Cl.
*H03H 7/09* (2006.01)
*H03H 7/01* (2006.01)
*H02H 9/00* (2006.01)
*H03H 7/42* (2006.01)

(52) U.S. Cl.
CPC .......... *H03H 7/0115* (2013.01); *H02H 9/005* (2013.01); *H03H 7/0138* (2013.01); *H03H 7/09* (2013.01); *H03H 7/427* (2013.01)

(58) Field of Classification Search
CPC .... H02H 9/005; H03H 7/0115; H03H 7/0138; H03H 7/427; H03H 7/09

USPC .......................................... 333/12, 181, 185
See application file for complete search history.

(56) References Cited

U.S. PATENT DOCUMENTS

| | | | |
|---|---|---|---|
| 7,560,825 B2 | 7/2009 | Crawley | |
| 7,808,751 B2 | 10/2010 | Chen et al. | |
| 8,272,898 B2 | 9/2012 | Chow et al. | |
| 8,824,570 B2 | 9/2014 | Pischl | |
| 2010/0022133 A1* | 1/2010 | Chow ................ | H01R 13/6633 439/620.15 |
| 2014/0160608 A1 | 6/2014 | Mo et al. | |
| 2014/0320232 A1 | 10/2014 | Wei | |

(Continued)

FOREIGN PATENT DOCUMENTS

| | | |
|---|---|---|
| CN | 101673617 A | 3/2010 |
| CN | 202042753 U | 11/2011 |
| CN | 103199818 A | 10/2013 |

(Continued)

*Primary Examiner* — Rakesh Patel
(74) *Attorney, Agent, or Firm* — Wei Te Chung; Ming Chieh Chang

(57) ABSTRACT

The network filtering circuit includes a cable side for connection with a network cable, a physical side for connection with a mother board, and a plurality of transmission channels connected between the cable side and the physical side. Each of the transmission channels includes an isolation transformer with a primary coil connected with the cable side and a secondary coil coupling with the primary coil. A common mode choke has two first ends connected to the physical side and two opposite second ends. A pair of capacitors series connection with the corresponding second ends and are connected between the secondary coil and the common mode choke. The primary coil has a first center tap directly connected to a ground node.

2 Claims, 1 Drawing Sheet

(56) References Cited

U.S. PATENT DOCUMENTS

2017/0040968 A1\*  2/2017  Igarashi ................. H03H 7/427

FOREIGN PATENT DOCUMENTS

| | | |
|---|---|---|
| CN | 203456870 | 2/2014 |
| CN | 204179420 U | 2/2015 |
| CN | 204258285 U | 4/2015 |
| CN | 1658464 A | 8/2015 |
| TW | M402552 | 4/2011 |
| TW | M449299 | 3/2013 |
| TW | M461196 | 9/2013 |

\* cited by examiner

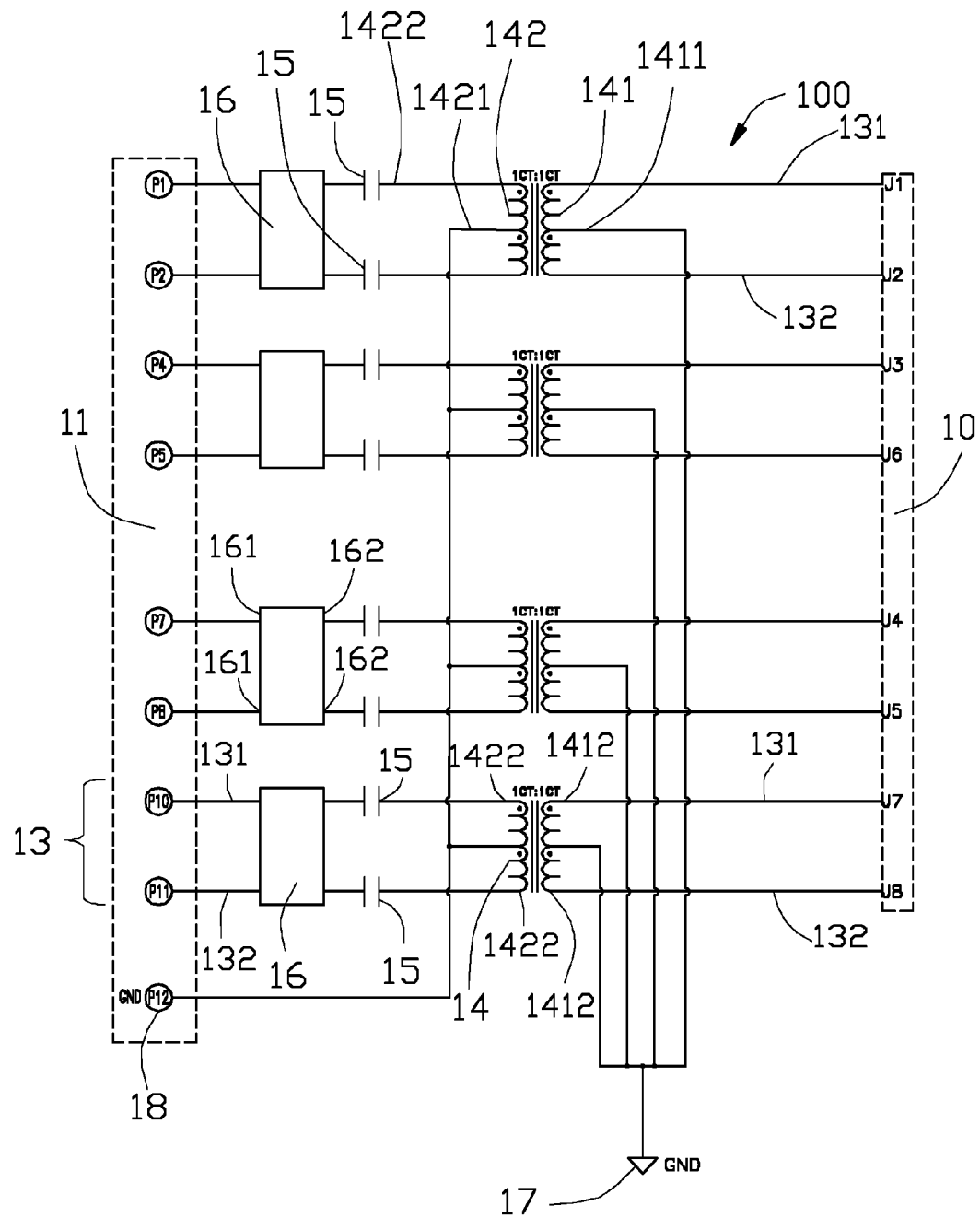

NETWORK FILTERING CIRCUIT FOR PROTECTION LIGHTNING SURGE

BACKGROUND OF THE INVENTION

1. Field of the Invention

The present invention relates to a network filtering circuit, and more particularly to a network filtering circuit for protection lightning surge.

2. Description of Related Arts

U.S. Pat. No. 8,272,898 discloses a network filtering circuit including a cable side, a physical side, and a plurality of transmission channels connected therebetween. Each of the transmission channels includes an isolation transformer with a primary coil connected to the cable side and a second coil connected to a common mode choke wherein the other side of the common mode choke is connected to the physical side. The primary coil has a center tap series connection with a capacitor and a resistor to a ground node. A surge would follow from the cable side to the ground node through the capacitor and the resistor, when the cable side is bearing a lightning. The capacitor and the resistor maybe damaged by the surge, after that the surge maybe coupled to the secondary coil from the primary coil and conducted to the physical side which has a network chip, therefore the network chip may be damaged by the surge.

U.S. Patent Application Publication No. 2014/0160608 discloses a network filtering circuit including a plurality of transmission channels connected between a cable side and a physical side. Each channel includes two parallel transmission routes. Each channel includes an autotransformer in parallel connection with the two routes and two capacitors series connected with the two routes, respectively. The autotransformer has a center tap directly connected to a ground node and simultaneously connected with the cable side and the physical side.

Therefore, a network filtering circuit for protection lightning surge is desired.

SUMMARY OF THE INVENTION

Accordingly, an object of the present invention is to provide network filtering circuit including a cable side for connection with a network cable, a physical side for connection with a mother board, and a plurality of transmission channels connected between the cable side and the physical side. Each of the transmission channels includes an isolation transformer with a primary coil connected with the cable side and a secondary coil coupling with the primary coil. A common mode choke has two first ends connected to the physical side and two opposite second ends. A pair of capacitors series connection with the corresponding second ends and are connected between the secondary coil and the common mode choke. The primary coil has a first center tap directly connected to a first ground node. Notably, the surge could be directly conducted the ground node. Moreover, some unexpected surge coupled from the primary coil to the secondary coil is eliminated by the capacitors connected between the isolation transformer and the common mode choke.

Other objects, advantages and novel features of the invention will become more apparent from the following detailed description when taken in conjunction with the accompanying drawings.

BRIEF DESCRIPTION OF THE DRAWING

FIG. 1 is a network filtering circuit according to the invention.

DETAILED DESCRIPTION OF THE PREFERRED EMBODIMENT

Reference will now be made in detail to some preferred embodiments of the present invention.

Referring to FIG. 1, a network filtering circuit 100 according to the invention. The network filtering circuit 100 includes a cable side 10 for connection with a network cable, a physical side 11 for connection with a mother board, and a plurality of transmission channels 13 connected between the cable side 10 and the physical side 11. Each of the transmission channels 13 includes a first transmission wire 131 and a second transmission wire 132 for transmitting a pair of different signals.

Each of the transmission channels 13 has an isolation transformer 14, a common mode choke 16, and a pair of capacitors 15 connected therebetween. The isolation transformer 14 has a primary coil 141 connected with the cable side 10 and a secondary coil 142 coupling with the primary coil 141. The primary coil 141 includes a first center tap 1411 directly connected to a first ground node 17 and two first outer connecting ends 1412 connected to the first transmission wire 131 and the second transmission wire 132, respectively. The secondary coil 142 includes a second center tap 1421 directly connected to a second ground node 18 located at the physical side 11 and two second outer connecting ends 1422. The first ground node 17 and the second ground node 18 are short connected at the physical side 11.

The common mode choke 16 has two first ends 161 connected to the physical side 11 and two second ends 162 series connection with the pair of capacitors 15, respectively. The pair of capacitors 15 are series connected with the first and second transmission channels 131, 132. In one embodiment, the common mode choke 16 is a two-wire common mode choke has two magnetic wires. In another embodiment, the common mode choke 16 is a three-wire common mode choke has three magnetic wires.

The plurality of transmission channels 13 include four transmission channels 13 when the network filtering circuit 100 is used in 1000 Mbps network or a higher speed network. The plurality of transmission channels 13 only include two transmission channels 13 when the network filtering circuit 100 is used in 10/100 Mbps network.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:
1. A network filtering circuit, comprising:
a cable side for connection to a network cable;
a physical side for connection to a mother board; and
a plurality of transmission channels connected between the cable side and the physical side, each transmission channel comprising:

an isolation transformer with a primary coil connected to the cable side and a secondary coil with two outer connecting ends;
a pair of capacitors connected in series with the corresponding two outer connecting ends; and
a common mode choke having two first ends connected to the physical side and two opposite second ends connected with the pair of capacitors, respectively;
wherein the primary coil has a first center tap directly connected to a first ground node, the secondary coil has a second center tap directly connected to a second ground node, and the common mode choke is a three-wire common mode choke.

2. The network filtering circuit as recited in claim 1, wherein the first ground node and the second ground node are short connected at the physical side.

* * * * *